April 8, 1969 SADAMICHI SOMEDA 3,437,946

COMPLEMENTARY SYMMETRY TRANSISTOR AMPLIFIER CIRCUIT EMPLOYING DRIVE SIGNAL LIMITING MEANS

Filed Sept. 14, 1966 Sheet 1 of 3

INVENTOR
SADAMICHI SOMEDA

BY Wenderoth, Lind and Ponack
ATTORNEYS

INVENTOR
SADAMICHI SOMEDA

BY Wenderoth, Lind and Ponack

ATTORNEYS

INVENTOR
SADAMICHI SOMEDA

BY Wenderoth, Lind and Ponack
ATTORNEYS

United States Patent Office
3,437,946
Patented Apr. 8, 1969

3,437,946
COMPLEMENTARY SYMMETRY TRANSISTOR AMPLIFIER CIRCUIT EMPLOYING DRIVE SIGNAL LIMITING MEANS

Sadamichi Someda, Hirakata-shi, Japan, assignor to Matsushita Electric Industrial Co., Ltd., Osaka, Japan
Filed Sept. 14, 1966, Ser. No. 579,274
Claims priority, application Japan, Nov. 1, 1965, 40/67,752, 40/67,754
Int. Cl. H03f 3/18, 3/26, 3/42
U.S. Cl. 330—13 18 Claims This invention relates in general to transistor amplifier circuits, and more particularly to complementary symmetry push-pull type transistor amplifier circuits employing a complementary symmetry connection or a quasi-complementary symmetry connection.

Transistor amplifiers are characterized by their small size, light weight and high efficiency as compared with vacuum tube amplifiers. These features are particularly apparent in complementary symmetry transistor amplifiers or quasi-complementary symmetry transistor amplifiers which need no input and/or output transformers in the output stage. On the other hand, however, conventional complementary or quasi-complementary symmetry transistor amplifiers have the drawback such that the output transistors are apt to be destroyed when the input signal includes therein a sudden noise component having an excessively large amplitude.

An object of this invention is to provide an improved complementary or quasi-complementary symmetry transistor amplifier circuit which can operate safely when the input signal includes a sudden noise component having an excessively large amplitude.

Another object of this invention is to provide an improved complementary or quasi-complementary symmetry connected transistor amplifier circuit which is protected against damage to the output transistors by an excessively large amplitude sudden noise signal which employs drive signal limiting means for the output transistors.

These and other objects will be readily apparent to those skilled in the art from the following specification and accompanying drawings wherein.

Figure 2:
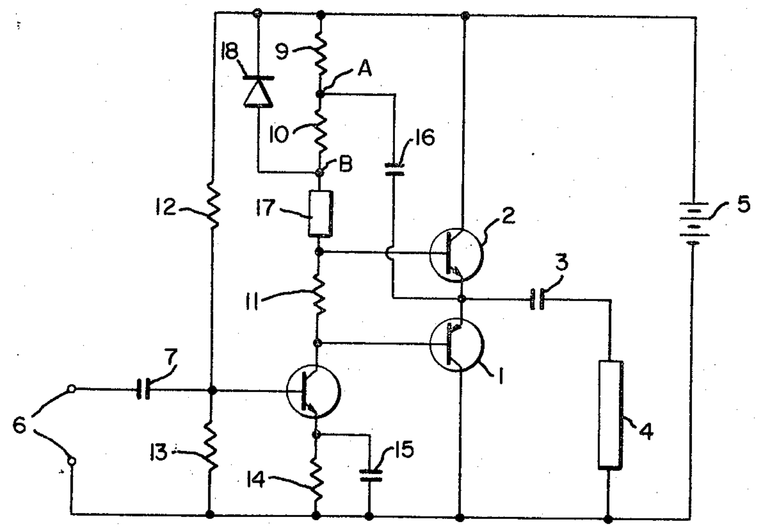
FIG. 2 is a circuit diagram of one embodiment of a complementary symmetry connected transistor amplifier including drive signal limiting means for achieving a stable operation of the output transistors in accordance with the present invention.
Figure 4:
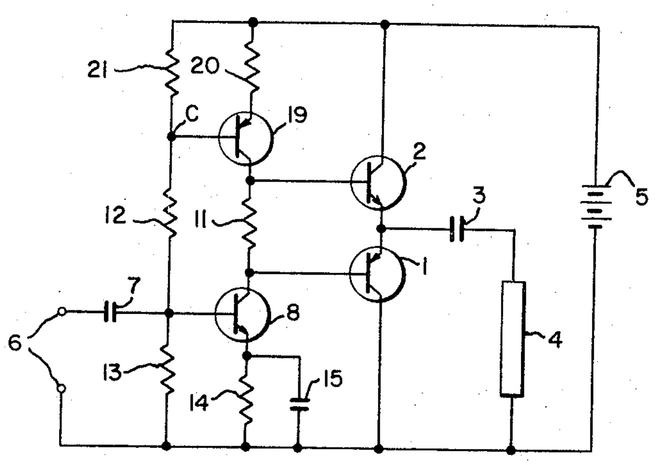
Figure 5:
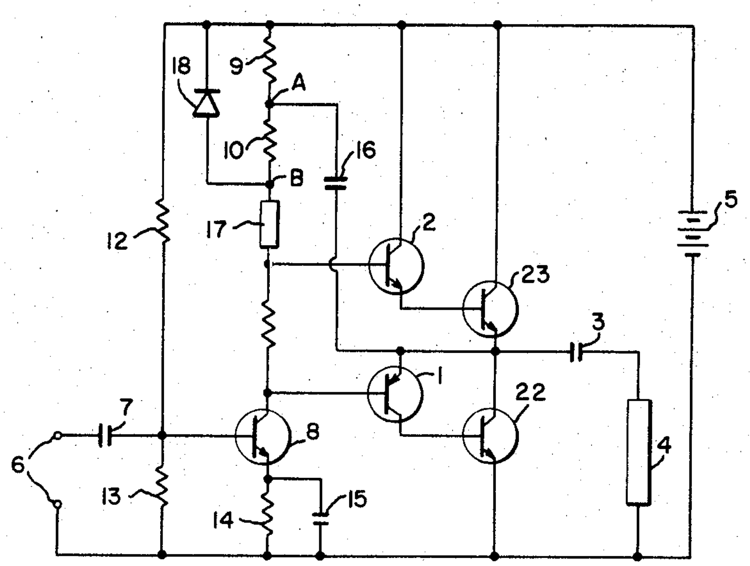
Figure 6:
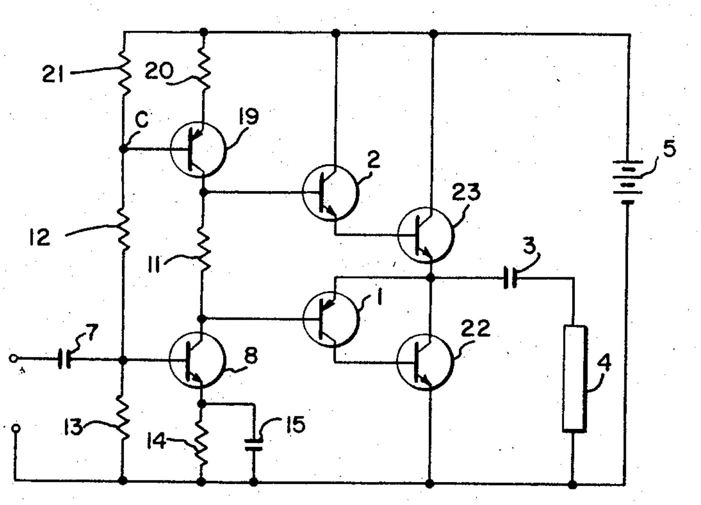

FIGS. 3*a*–3*d* are diagrammatic representations of direct current conductive elements employed in the circuits of FIG. 2 and FIG. 5;

FIG. 4 is a circuit diagram of another embodiment of a complementary symmetry connected transistor amplifier employing drive signal limiting means for achieving a stable operation of the output transistors in accordance with the present invention; and FIGS. 5 and FIG. 6 are circuit diagrams of quasi-complementary symmetry connected transistor amplifiers employing drive signal limiting means in accordance with the present invention.

Figure 1:
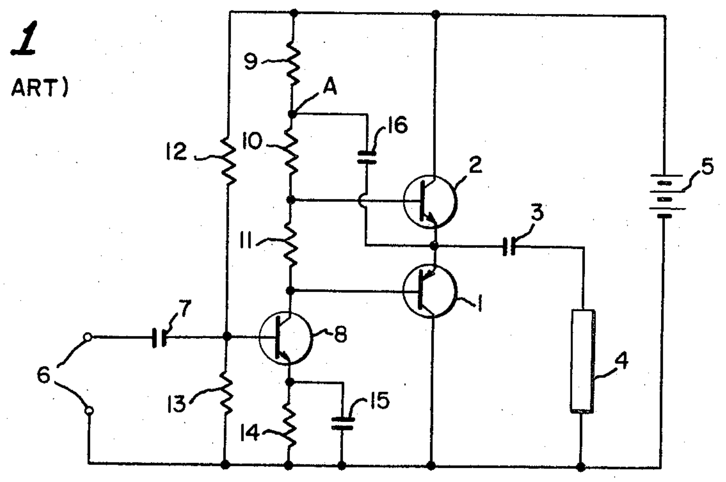
FIG. 1 (PRIOR ART)
FIG. 1 is a circuit diagram of a conventional complementary symmetry transistor amplifier.

Referring to FIG. 1, transistors 1 and 2 are p-n-p and n-p-n types respectively, and are connected to provide class B complementary symmetry push-pull operation. The output circuit for the push-pull stage includes the two emitters of transistors 1 and 2, these two emitters being connected together. Also, there is included in the output circuit a load impedance 4 connected to the junction of said two emitters through a coupling capacitor 3. The respective collectors of the transistors 1 and 2 are connected to the negative and positive terminals of a direct current power supply 5. A biasing circuit including resistors 9 and 10 is connected between the positive terminal of the direct current power supply 5 and the base of the transistor 2 for supplying a bias voltage to the transistors 1 and 2. The input circuit for the push-pull stage includes an n-p-n driver transistor 8 and a biasing resistor 11 connected between thte base electrodes of the transistors 1 and 2. Input terminals 6 are coupled to the base of the driver transistor 8 through a coupling capacitor 7 and to the emitter thereof through resistance 14. The base of the driver transistor 8 is also supplied with a bias voltage from the power supply 5 through resistors 12 and 13. The emitter of the driver transistor 8 is also connected to the negative terminal of the power supply 5 through a resistor 14. The resistor 14, together with the bias voltage supplied to the base, determines the D.C. collector current of the driver transistor 8. The resistor 14 has a capacitor 15 coupled in parallel therewith, so the gain of the amplifier circuit is not decreased at signal frequencies. The collector electrode of the driver transistor 8 is coupled to the base of the transistor 1 for applying a drive signal to the transistors 1 and 2.

It is preferable that the biasing circuit including the resistors 9 and 10 have a voltage drop aproximately equal to half of the D.C. supply voltage when the D.C. collector current of the driver transistor 8 flows in the biasing circuit, and that consequently the emitter-to-collector voltages of the transistors 1 and 2 will be about half of the direct current supply voltage respectively when no input signal is applied. Furthermore, the resistance of the resistor 11 is selected to have a value such that the voltage drop of the D.C. collector current of the driver transistor 8 across the resistor 11 supplies a small initial differential forward bias to the bases of the transistors 1 and 2 for producing a small static collector current through transistors 1 and 2 so as to minimize the cross-over distortion.

A feedback capacitor 16 having a low impedance at signal frequencies is connected between the common emitters of transistors 1 and 2 and the junction point A between the resistors 9 and 10. As the result of the signal feedback through the capacitor 16, the current through the resistor 10 is kept substantially constant regardless of any variation in the output voltage across the load impedance 4 so that the dynamic impedance of the biasing circuit including the resistor 10 is greatly increased. Hence, the gain of the amplifier circuit is signal frequencies is increased and the transistor 2 is supplied with a sufficient drive current even at a positive peak of the output signal.

In normal operation, the input signal is applied at the input terminals 6 and supplied to the base of the driver transistor 8. The amplified current at the collector of the driver transistor 8 is supplied to the bases of the push-pull output transistors 1 and 2. Finally, the output signal appears at the common emitters of the transistors 1 and 2, and is supplied to the load impedance 4.

The amplifier circuit operates in a somewhat unusual manner when the input terminals 6 are provided with a sudden noise signal having a much larger amplitude than the normal input signal. Such a sudden noise signal is apt to be generated by a switching transient in the preceding amplifying stage connected to the input terminals 6, or by a voltage electrostatically or electro-magnetically induced in a transmission line connected to the input terminals 6. As soon as an excessively large amplitude positive signal is applied at the input terminals 6, the driver transistor 8 bottoms and the transistor 1 conducts so as to supply a maximum negative output signal to the load impedance 4. At this moment, the collector-to-emitter voltage of the driver transistor 8 becomes very low and the collector-to-base voltage of the transistor 1 is substantially equal to the voltage drop across the resistor 14 caused by the D.C. collector current of the driver transistor 8, which voltage is usually high enough to prevent the transistor 1 from bottoming. Therefore, the transistor 1 is cut-off without any time delay when the input signal changes to an excessively large negative value, and when the driver transistor 8 is cut-off at the next moment. Thus, an abnormal operation will not take place. However, after the driver transistor 8 is cut-off by the excessively large amplitude negative input signal, the base of the transistor 2 is supplied with a base current substantially equal to the D.C. collector current of the driver transistor 8 as positive feedback takes place through the capacitor 16, as explained hereinbefore. Generally, the D.C. collector current of the driver transistor 8 will be chosen so as to be much higher than the base current of the transistor 2 in order to produce a positive peak output signal regardless of any variation in the current amplification factor of the transistor 2 and/or other circuit parameters. Hence, when the driver transistor 8 is cut-off, the transistor 2 bottoms heavily due to the large base current. When the input signal is switched back to an excessively large positive value in a short period of time, the driver transistor 8 bottoms again so that the transistor 1 conducts and the transistor 2 tends to cut-off. The transistor 2, however, remains bottomed and maintains a low collector-to-emitter impedance for a short period of time after the switching of the input signal because of the storage effect of the minority carrier in the transistor 2. Therefore, both the transistors 1 and 2 conduct heavily during this short period of time, and the transistor 1 is apt to be damaged by an excessively large collector dissipation which is caused by the large collector current when the collector-to-emitter voltage is substantially equal to the direct current supply voltage.

This dangerous operation of the amplifier is caused by the bottoming of the transistor 2. Therefore, the damage to the transistor 1 can be avoided by preventing the transistor 2 from bottoming. This is accomplished by limiting the drive signal of the transistor 2 when an excessively large amplitude negative input signal is applied to the amplifier circuit.

A modified transistor amplifier circuit in accordance with this invention is illustrated in FIG. 2. The same reference characters are used in FIG. 2 and other figures to indicate components similar to the components in FIG. 1.

Figure 3A:
Figure 3B:
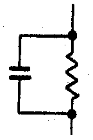
Figure 3C:
Figure 3D:

Referring to FIG. 2, the amplifier comprises the input terminals 6, the driver transistor 8 and the output transistors 1 and 2, and the load impedance 4 connected in the same manner as in the circuit shown in FIG. 1. In addition, a direct current conductive element 17 is connected in series with the resistor 10 and produces a voltage drop of approximately one volt or a little more in the base current of the transistor 2 when the driver transistor 8 is cut-off. A drive signal limiting diode 18 is connected between the junction point B between the resistor 10 and the element 17 and the collector of transistor 2 in a direction so that the diode 18 is reverse biased when the amplifier is provided with the small signal. As a practical matter, the element 17 can be a simple resistor such as shown in FIG. 3*a*, a combination of a resistor and a capacitor connected in parallel as shown in FIG. 3*b*, one or more diodes connected in series as shown in FIG. 3*c*, or a Zener diode as shown in FIG. 3*d*.

Referring to FIG. 2 again, when the driver transistor 8 is cut-off by the excessively large amplitude negative signal applied to the input terminals 6, the transistor 2 conducts, and the potential of the junction point A of the resistors 9 and 10 is higher than the potential of the collector of the transistor 2 because the voltage across the capacitor 16 remains substantially constant regardless of any variation in the input signal. In addition, the potential of the junction point B also tends to become higher than the potential of the collector of the transistor 2. Thus, the diode 18 conducts and the potential of the junction point B is restricted to a limited value slightly higher than the potential of the collector of the transistor 2 by an amount determined by the voltage drop in the diode 18. Therefore, the collector-to-base voltage of the transistor 2 will not fall below approximately one volt, which is the difference between the voltage drops across the element 17 and the diode 18. Accordingly, transistor 2 never bottoms and the storage effect can be avoided. Hence, the transistor 2 is cut-off without a time delay after the driver transistor 8 is caused to bottom by the large amplitude positive input signal and the transistors 1 and 2 will not conduct heavily at the same time. Thus, the transistor 1 cannot be damaged by the excessively large collector dissipation.

Referring to FIG. 4, there is shown another embodiment of the amplifier according to the invention in which the input terminals 6, the driver transistor 8 and the output transistors 1 and 2, and the load impedance 4 are connected in the same manner as in the circuit shown in FIG. 1. In addition, a current regulating p-n-p type transistor 19 is connected in the biasing circuit for the transistors 1 and 2. The emitter of the transistor 19 is connected to the positive terminal of the power supply 5 through a resistor 20. The collector of the transistor 19 is coupled to the base of transistor 2, and the base of the transistor 19 is connected to a direct current reference point C. The potential of the reference point C is determined by the power supply voltage and resistors 21, 12 and 13, and the resistance of the resistor 21 is selected so that the potential of the reference point C is lower by about one volt than the power supply voltage. Hence, the bias voltage for the transistors 1 and 2 is supplied from the power supply 5 through the resistor 20 and the emitter-to-collector impedance of the transistor 19. The collector current of the transistor 19 is substantially constant regardless of any variation in the collector voltage when the transistor 19 operates in the active region, and the dynamic emitter-to-collector impedance of the transistor 19 remains at a very high value. Accordingly, in normal operation, the gain of the amplifier circuit illustrated in FIG. 4 will be as high as that illustrated in FIG. 1. However, when the driver transistor 8 is cut off by an excessively large amplitude negative input signal, the transistor 19 bottoms and the collector voltage of the transistor 19 is held at the base voltage having the potential of the reference point C. Therefore, the collector-to-base voltage of the transistor 2 will not fall below approximately one volt and the transistor 2 never bottoms. Thus, the transistor 19 provides the drive signal limiting action for the transistor 2, and damage to the transistor 1 as mentioned before is avoided.

Referring to FIG. 5, there is shown a quasi-complementary symmetry connected amplifier according to the present invention in which the emitter and the collector of the transistor 1 are connected to the collector and the base of an n-p-n transistor 22 respectively, and the transistor 1 drives the transistor 22. Furthermore, the emitter and the collector of the transistor 2 are connected to the base and the collector of another n-p-n transistor 23 respectively, and the transistor 2 drives the transistor 23. The collector of the transistor 22 and the emitter of the transistor 23 are connected together so as to provide an output circuit for the amplifier. The emitter of the transistor 22 and the collector of the transistor 23 are connected to the negative and the positive terminal of the direct current power supply 5, respectively. The combination of these transistors 1, 2, 22 and 23 is known as a quasi-complementary symmetry push-pull circuit. The input circuit for the push-pull stage has the same circuit arrangement as the circuit for the complementary symmetry push-pull stage illustrated in FIG. 2. The feedback circuit including the capacitor 16 increases the gain of the amplifier circuit, and also supplies sufficient base current to the transistor 2 even at the positive peak of the output signal. Furthermore, the direct current conductive element 17 and the drive signal limiting diode 18 constitute the drive signal limiting circuit for the transistor 2. The element 17 should provide a voltage drop of approximately one volt or a little more in the base current of the transistor 2 when the driver transistor 8 is cut off. The elements as illustrated in FIG. 3 can be used as the element 17 in FIG. 5 in a way similar to their use in the circuit shown in FIG. 2. When the drive signal limiting circuit including the element 17 and the diode 18 is not incorporated in the amplifier circuit, the transistors 2 and 23 bottom when the driver transistor 8 is cut off by an excessively large amplitude negative input signal. When the input signal again changes to an excessively large positive value in a short period of time, the driver transistor 8 bottoms so that the transistors 1 and 22 conduct and the transistors 2 and 23 tend to become cut off. However, the transistors 2 and 23 remain bottom for a certain period of time after the change of the input signal because of the storage effect of the minority carrier in the transistors 2 and 23. Therefore, all of the transistors 1, 2, 22 and 23 conduct heavily during the period, and the transistors 1 and 22 are apt to be destroyed by the excessively large collector current when the collector-to-emitter voltage is substantially equal to the direct current supply voltage. By employing the drive signal limiting circuit including the element 17 and the diode 18, the collector-to-base voltage of the transistor 2 will not fall below approximately one volt, and the transistors 2 and 23 never bottom, as explained in connection with the circuit illustrated in FIG. 2. Accordingly, accidental damage to the transistor 1 and 22 can be completely avoided.

Referring to FIG. 6, there is shown another embodiment of a quasi-complementary connected amplifier circuit in which the input terminals 6, the driver transistor 8 and the quasi-complementary symmetry connected output transistors 1, 2, 22 and 23, and the load impedance 4 are connected as in FIG. 5. A current regulating transistor 19 supplies the bias voltage to the transistors 1, 2, 22 and 23 through its emitter-to-collector impedance. The base of the transistor 19 is connected to the direct current reference point C, the potential of which is determined by the power supply voltage and the resistors 21, 12 and 13 in the same manner as in the circuit illustrated in FIG. 4. The transistor 19 bottoms when the driver transistor 8 is cut off by an excessively large amplitude negative input signal, and the collector voltage of the transistor 19 is held at the potential of the reference point C, and the transistor 2 never bottoms. Therefore, the failure of the transistors 1 and 22, as mentioned before, can be avoided.

As explained hereinbefore, the directions of the conductivities of every transistor are fixed. However, it will be easily understood that the same operation as that mentioned above can be obtained by reversing the directions of the conductivities of each of the transistors and the polarity of the power supply 5. Furthermore, the operation of the output transistors is not necessarily restricted to class B operation. Class A or even class C operation can be accomplished by using a proper biasing arrangement without spoiling the effect of this invention.

Obviously, many modifications and variations of the invention are possible in the light of the above teachings. It is therefore to be understood that within the scope of the appended claims the invention may be practiced otherwise than as specifically described.

What is claimed is:

1. A transistor amplifier circuit comprising a first and second transistor which are opposite conductivity types and each having base, emitter and collector electrodes; an output circuit connected in common with the emitter electrodes of said first and second transistors for deriving output signals therefrom; a direct current power supply means having a first and second terminal, the first and second terminal of said direct current power supply means being connected to the collector electrodes of said first and second transistors, respectively; an input circuit connected in parallel to the base electrodes of said first and second transistors for applying drive signals thereto; and biasing circuit means connected between the second terminal of said direct current power supply means and the base electrode of said second transistor for supplying a bias voltage to said first and second transistors, said biasing circuit means including drive signal limiting means for said second transistor to prevent said second transistor from bottoming.

2. A transistor amplifier circuit as claimed in claim 1 in which said biasing circuit means comprises a current regulating transistor of the same conductivity type as said first transistor and having base, emitter and collector electrodes; the emitter electrode of said current regulating transistor being direct current conductively connected with the second terminal of said direct current power supply means; the collector electrode of said current regulating transistor being direct current conductively connected with the base electrode of said second transistor; and the base electrode of said current regulating transistor being connected to a direct current reference point; the potential of said direct current reference point being slightly lower than the voltage of the second terminal of said direct current power supply means so that said current regulating transistor provides drive signal limiting action for preventing said second transistor from bottoming.

3. A transistor amplifier circuit as claimed in claim 1 which has signal feedback means connected between said output circuit and said biasing circuit means, said signal feedback means having low impedance at signal frequencies.

4. A transistor amplifier circuit as claimed in claim 1 in which said biasing circuit means includes a first, a second, and a third direct current conductive element, said elements being connected in series and in the recited order; signal feedback means connected between said output circuit and the junction point of said first and second conductive elements; said signal feedback means including a capacitor having a low impedance at signal frequencies; and drive signal limiting means connected between the collector electrode of said second transistor and the junction point of said second and third direct current conductive elements of preventing said second transistor from bottoming.

5. A transistor amplifier circuit as claimed in claim 4 in which said drive signal limiting means comprises a diode connected such that said diode is reverse biased when said amplifier is supplied with a small signal.

6. A transistor amplifier circuit as claimed in claim 4 in which said third direct current conductive element is a resistor.

7. A transistor amplifier circuit as claimed in claim 4 in which said third direct current conductive element is a resistor and a capacitor connected in parallel.

8. A transistor amplifier circuit as claimed in claim 4 in which said third direct current conductive element comprises one or more diodes connected in series so that the bias current for said second transistor flows through said diodes in the forward direction.

9. A transistor amplifier circuit as claimed in claim 4 in which said third direct current conductive element comprises a Zener diode, the bias current for said second transistor flowing through said Zener diode in the reverse direction.

10. A transistor amplifier circuit comprising a first and second transistor which are the same conductivity type and each having base, emitter and collector electrodes; an output circuit connected in common with the collector electrode of said first transistor and the emitter electrode of said second transistor for deriving output signals therefrom; a third transistor which is the opposite conductivity type and having base, emitter and collector electrodes, the collector and emitter electrodes of said third transistor being direct current conductively coupled with the base and collector electrodes of said first transistor, respectively; a fourth transistor which is the same conductivity type as said first and second transistors and having base, emitter and collector electrodes, the emitter and collector electrodes of said fourth transistor being direct current conductively coupled with the base and collector electrodes of said second transistor, respectively; a direct current power supply means having a first and second terminal, the first and second terminals of said direct current power supply means being connected with the emitter electrode of said first transistor and the collector electrode of said second transistor, respectively; an input circuit connected in parallel with the base electrodes of said third and fourth transistors for applying drive signals thereto; biasing circuit means connected between the second terminal of said direct current power supply means and the base electrode of said fourth transistor for providing a bias voltage for said first, second, third and fourth transistors, said biasing circuit means including drive signal limiting means for said second and fourth transistors to prevent said second and fourth transistors from bottoming.

11. A transistor amplifier circuit as claimed in claim 10 in which said biasing circuit means comprises a current regulating transistor of the opposite conductivity type from said first and second transistors and having base, emitter and collector electrodes; the emitter electrode of said current regulating transistor being direct current conductively connected with the second terminal of said direct current power supply means, the collector electrode of said current regulating transistor being direct current conductively connected with the base electrode of said fourth transistor, and the base electrode of said current regulating transistor being connected to a direct current reference point, the potential of said direct current reference point being slightly lower than the second terminal voltage of said direct current power supply means so that said current regulating transistor provides drive signal limiting action for preventing said second and forth transistors from bottoming.

12. A transistor amplifier circuit as claimed in claim 10 which has signal feedback means connected between said output circuit and said biasing circuit means, said signal feedback means having low impedance at signal frequencies.

13. A transistor amplifier circuit as claimed in claim 10 in which said biasing circuit means includes a first, a second and a third direct current conductive element, said elements being connected in series and in the recited order; signal feedback means connected between said output circuit and the junction point of said first and second conductive elements; said signal feedback means including a capacitor having low impedance at signal frequencies; and drive signal limiting means connected between the collector electrode of said second transistor and the junction point of said second and third direct current conductive elements for preventing said second and fourth transistor from bottoming.

14. A transistor amplifier circuit as claimed in claim 13 in which said drive signal limiting means comprises a diode connected such that said diode is reverse biased when said amplifier is supplied with a small signal.

15. A transistor amplifier circuit as claimed in claim 13 in which said third direct current conductive element is a resistor.

16. A transistor amplifier circuit as claimed in claim 13 in which said third direct current conductive element is a resistor and a capacitor connected in parallel.

17. A transistor amplifier circuit as claimed in claim 13 in which said third direct current conductive element comprises one of more diodes connected in series so that the bias current for said fourth transistor flows through said diodes in the forward direction.

18. A transistor amplifier circuit as claimed in claim 13 in which said third direct current conductive element comprises a Zener diode, the bias current for said fourth transistor flowing through said Zener diode in the reverse direction.

References Cited

UNITED STATES PATENTS 2,896,029 7/1959 Lin ---------------- 330—13

ROY LAKE, *Primary Examiner.*

JAMES B. MULLINS, *Assistant Examiner.*

U.S. Cl. X.R.

330—15, 18